United States Patent [19]

Billington et al.

[11] Patent Number: 5,258,915
[45] Date of Patent: Nov. 2, 1993

[54] SYSTEM AND METHOD FOR OPTIMUM OPERATION ASSIGNMENTS IN PRINTED CIRCUIT BOARD MANUFACTURING

[75] Inventors: Corey A. Billington, San Jose; Margaret L. Brandeau, Los Altos, both of Calif.

[73] Assignee: Hewlett-Packard Company, Palo Alto, Calif.

[21] Appl. No.: 590,611

[22] Filed: Sep. 28, 1990

[51] Int. Cl.$^5$ .............................................. G06F 15/46
[52] U.S. Cl. ..................................... 364/468; 364/402
[58] Field of Search .............. 364/468, 403, 402, 401, 364/474.15, 148

[56] References Cited

U.S. PATENT DOCUMENTS

| | | | |
|---|---|---|---|
| 4,646,238 | 2/1987 | Carlson, Jr. et al. | 364/403 |
| 4,648,023 | 3/1987 | Powell | 364/468 |
| 4,706,187 | 11/1987 | Arai et al. | 364/468 |
| 4,885,686 | 12/1989 | Vanderbei | 364/468 |
| 4,887,207 | 12/1989 | Natarajon | 364/468 |
| 5,077,661 | 12/1991 | Jain et al. | 364/402 |
| 5,170,554 | 12/1992 | Davis et al. | 364/468 |

OTHER PUBLICATIONS

A. Rajan et al., *Assigning Components to Robotic Workcells for Electronic Assembly,* AT&T Technical Journal, May/Jun. 1989, p. 93.

Primary Examiner—Jerry Smith
Assistant Examiner—Thomas E. Brown
Attorney, Agent, or Firm—David S. Romney

[57] ABSTRACT

A method for the design of a production process determines the assignment of operations to one or more machines where each machine has a given capacity for installing multiple parts to items in an assembly line. A list of parts of each different item to be assembled is prepared. The production demand for each different item is determined. An algorithm based on the parts list and the production demand is applied to determine an assignment of operations to the one or more machines so that total setup and processing cost is minimized. Operations are assigned to the one or more machines based on the application of the algorithm.

2 Claims, 9 Drawing Sheets

| COMPONENT / BOARD | 1 | 2 | 3 | 4 | 5 | 6 | 7 | 8 |
|---|---|---|---|---|---|---|---|---|
| 1 | 1 | 0 | 0 | 0 | 0 | 0 | 0 | 0 |
| 2 | 0 | 1 | 1 | 0 | 0 | 0 | 0 | 0 |
| 3 | 0 | 1 | 0 | 1 | 0 | 0 | 0 | 0 |
| 4 | 0 | 0 | 0 | 0 | 1 | 1 | 1 | 1 |
| 5 | 0 | 0 | 0 | 0 | 1 | 0 | 1 | 1 |
| 6 | 0 | 0 | 0 | 0 | 0 | 1 | 1 | 1 |
| 7 | 0 | 0 | 0 | 0 | 1 | 1 | 1 | 0 |

| COMPONENT # BOARD # | 1 | 2 | 3 | 4 | ... | $N_1$ | $N_1+1$ | $N_1+2$ | ... | $2N_1$ |
|---|---|---|---|---|---|---|---|---|---|---|
| 1 | v | 0 | 0 | 0 | ... | 0 | 0 | 0 | ⋮ | 0 |
| 2 | 0 | v | 0 | 0 | ... | 0 | 0 | 0 | ⋮ | 0 |
| 3 | 0 | 0 | v | 0 | ... | 0 | 0 | 0 | ⋮ | 0 |
| 4 | 0 | 0 | 0 | v | ... | 0 | 0 | 0 | ⋮ | 0 |
| ... | | | | | | | | | | |
| $N_1$ | 0 | 0 | 0 | 0 | ... | v | 0 | 0 | ⋮ | 0 |
| $N_1+1$ | 0 | 0 | 0 | 0 | ... | 0 | 2v | 2v | ⋮ | 2v |

| COMPONENT # BOARD # | 1 | 2 | 3 | ...$N_1$ | $N_1+1$ | $N_1+2$ | $N_1+3$ | $N_1+4$ | ... | $2N_1$ |
|---|---|---|---|---|---|---|---|---|---|---|
| 1 | v | o | o | ...o | | | | | | |
| 2 | o | v | o | ...o | | | | | | |
| 3 | o | o | v | ...o | | | o | | | |
| ...$N_1$ | o | o | o | ...v | | | | | | |
| $N_1+1$ | v | o | o | ...o | v | v | o | o | ... | o |
| $N_1+2$ | o | v | o | ...o | v | v | o | o | ... | o |
| ... | | | | | v | v | o | o | ... | o |
| $N_1+N_1$ | v | o | o | ...o | v | o | v | o | ... | o |
|  | v | v | o | o | v | o | v | o | ... | o |

FIG 5

SYSTEM AND METHOD FOR OPTIMUM OPERATION ASSIGNMENTS IN PRINTED CIRCUIT BOARD MANUFACTURING

RELATED APPLICATIONS

This application relates to copending application Ser. No. 07/589,748, now U.S. Pat. No. 5,170,554 filed by inventors Thomas C. Davis and Eva M. Selep, entitled "High Mix Printed Circuit Assembly Technique", which is owned by the assignee of the present application and is incorporated herein by reference.

BACKGROUND OF THE INVENTION

This invention relates generally to work allocation in an assembly line, and more specifically to operation assignment problems in a printed circuit (PC) board assembly process.

Along with the advent of powerful automated manufacturing systems has come a host of complex design and control problems. These problems include machine grouping, part type selection, operation assignment, fixture allocation, and tool loading. Some of these problems have already been considered in the prior art, such as the tool loading problem of Flexible Manufacturing Systems (FMS's). That problem is to allocate operations and required tools among groups of machines, while meeting technological and capacity constraints of the machines. The prior art suggested a number of different objectives, including balancing machine workloads and minimizing the number of movements of jobs between machines. One prior formulation of the FMS tool loading problem is an assignment problem with a linear objective—that of assigning job types to machines in order to minimize total variable processing cost per job, subject to machine capacity constraints.

Other prior formulations of the FMS tool loading problem consider the variable cost associated with each operation. In contrast, the assignment problem of the present invention includes not only variable processing cost per operation, but also a one time setup cost per job if any operations of a given job are carried out on a particular machine. This setup cost is incurred because of the particular technology we are considering, as described below. In addition, the FMS tool loading problem is a tactical problem that is concerned with objectives such as maximizing throughput or minimizing makespan, given a known set of jobs to be processed. Our assignment problem is a longer term planning problem that has the objective of minimizing expected production cost (or, equivalently, mibnimizing the average expected cost per unit produced) given estimates of expected future demand.

The problem solved by the present invention arose from conventional printed circuit (PC) board assembly operations wherein a unit assembles a number of different PC boards by inserting the appropriate components. The process is not fully automated because a wide mix of boards is produced, and the volume of production does not justy automation. Component insertion in this hand load cell can either be performed manually or by a semi-automated machine. Prior techniques did not adequately solve the assembly problems in this type of PC board manufacturing line.

OBJECTS AND SUMMARY OF THE INVENTION

An object of the invention is to provide a system and method for optimizing operation assignments in printed circuit board manufacturing involving components which can either be inserted on boards manually or by machine. A related object is to determine an optimum assignment of components ("operations") to a set of capacited machines to minimize the total setup and processing cost for assembling all boards, with the possibility of certain remaining components inserted manually.

Another object it to focus on an operation assignment problem to determine an assignment of operations to a set of capacited machines to minimize total setup and processing costs. Since these costs may be expressed in terms of time units required for setup and processing, a related object is to minimize the average time required to produce each PC board.

Even though the problem can be formulated as a mixed integer linear program, it is too large to be practically solved. Accordingly, in the case of a single machine the invention provides two different solution methods which individually can in certain circumstances be arbitrarily bad, but which on the average produce satisfactory results. In the case of multiple machines, the invention provides four different solution methods.

BRIEF DESCRIPTION OF THE DRAWINGS

FIG. 3 shows an application of the Greedy Board algorithm to an exemplary combination of components and boards;

FIG. 4 shows an application of the Stingy Component algorithm to another exemplary combination of components and boards;

FIG. 5 shows an application of the Greedy Board algorithm to a further combination of components and boards;

DETAILED DESCRIPTION OF PREFERRED EMBODIMENTS

There are many conventional PC board assembly operations which can be optimized by the present invention. For example, one manual insertion process works as follows: the board is set up on a tray, the operator locates the assembly instructions for this particular board in an instruction manual, and then follows the assembly instruction, obtaining individual components from labeled bins that are located in the assembly area, and inserting them manually onto the board. For the semi-automatic insertion process, the board is set up on a tray on a semi-automated component insertion machine, and the operator enters the board identification number into the computer that controls the machine. Then the machine identifies from a set of internal component bins the bin containing the first part that is needed, opens the bind, and moves it on the board where this component is to be inserted. The operator removes a component from the open bin, inserts it manually onto the board, and presses a switch indicating that another component is now needed. The machine then closes and removes the bin, pulls up the bin containing the next component that is required, and the process continues similarly until all components have been inserted. Note that there are no setup savings associated with producing two of the same type of boards sequentially; each board requires setup on any process where it undergoes component insertion. This is an example of a through-hole assembly process.

Both setup and processing are faster (i.e., cheaper) on a machine. However, the machines have a limited capacity for holding different components, and only a limited number of the machines are available. Furthermore, it is costly to change the assignment of fompo- nents to bins of the machine: such changes involve not only physical replacement of components in the bins inside the machine, but also reprogramming the machine's computer. In addition, costly reductions in board quality and yield may occur when the production process is changed (e.g., when a particular board is now assembled using a different machine). Thus, component assignment must be performed before any PC boards can be assembled, and cannot be changed during the entire assembly process of all boards. It is not possible to change the set of components on the machine until all the boards have been completely assembled. In a typical situation, a one-time tooling of machinges (i.e., assignment of components to bins) for the next year or half year is determined based on annual or semi-annual expected (high estimates of) demand for different types of boards. At the end of that time period, new demand estimates are generated, and the machines may be retooled.

Figure 1:
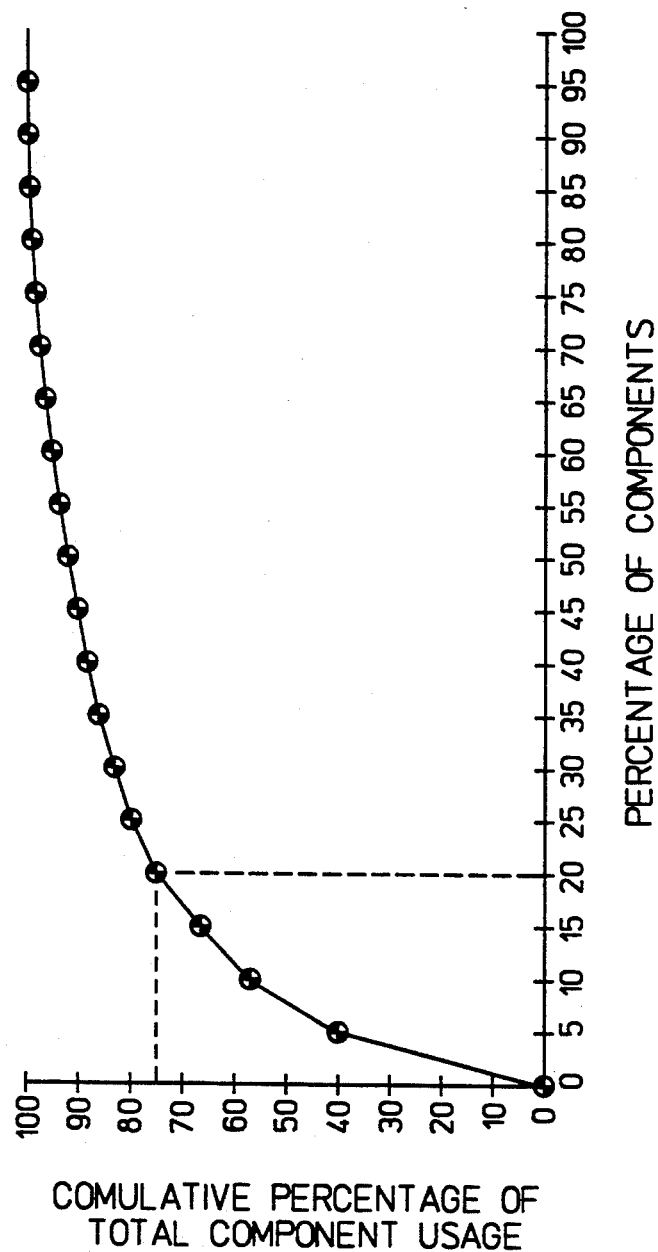
FIG. 1 is a graphical representation of actual data for an exemplary PC board assembly line.

As is typical in PC board assembly operations, a large number of different PC boards, assembled from an even larger number of components, must be produced. For example, in one typical manufacturing process, almost 500 types of PC boards are produced from some 4000 different parts. Another feature of interest is that some components are used much more frequently than others. FIG. 1 shows an actual cumulative component usage as apercentage of total usage for a sample of 30 boards assembled from over 300 components.

Figure 2:
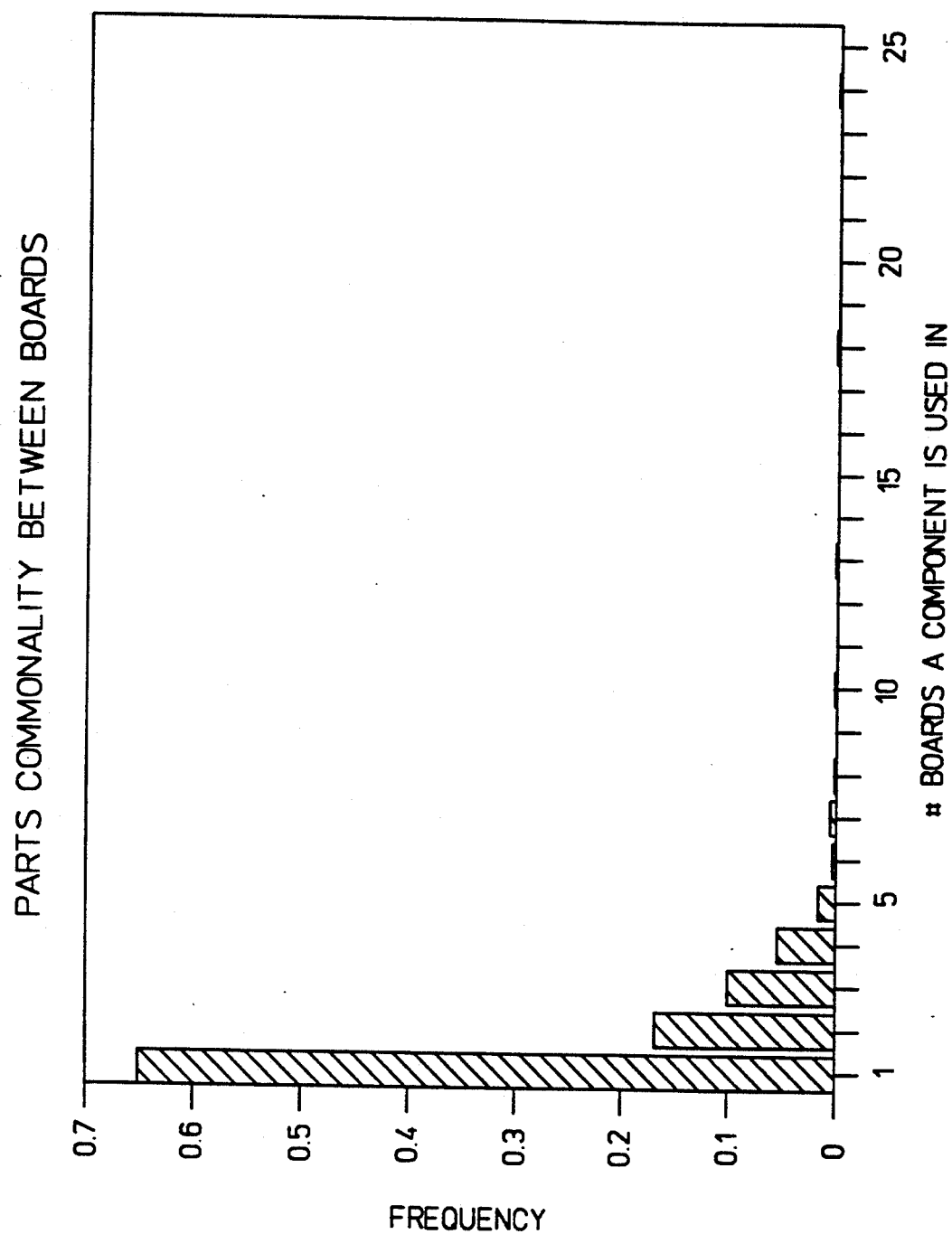
FIG. 2 is a different graphical representation of the exemplary PC board assembly line of FIG. 1 showing parts commonality between boards.
Figure 6:
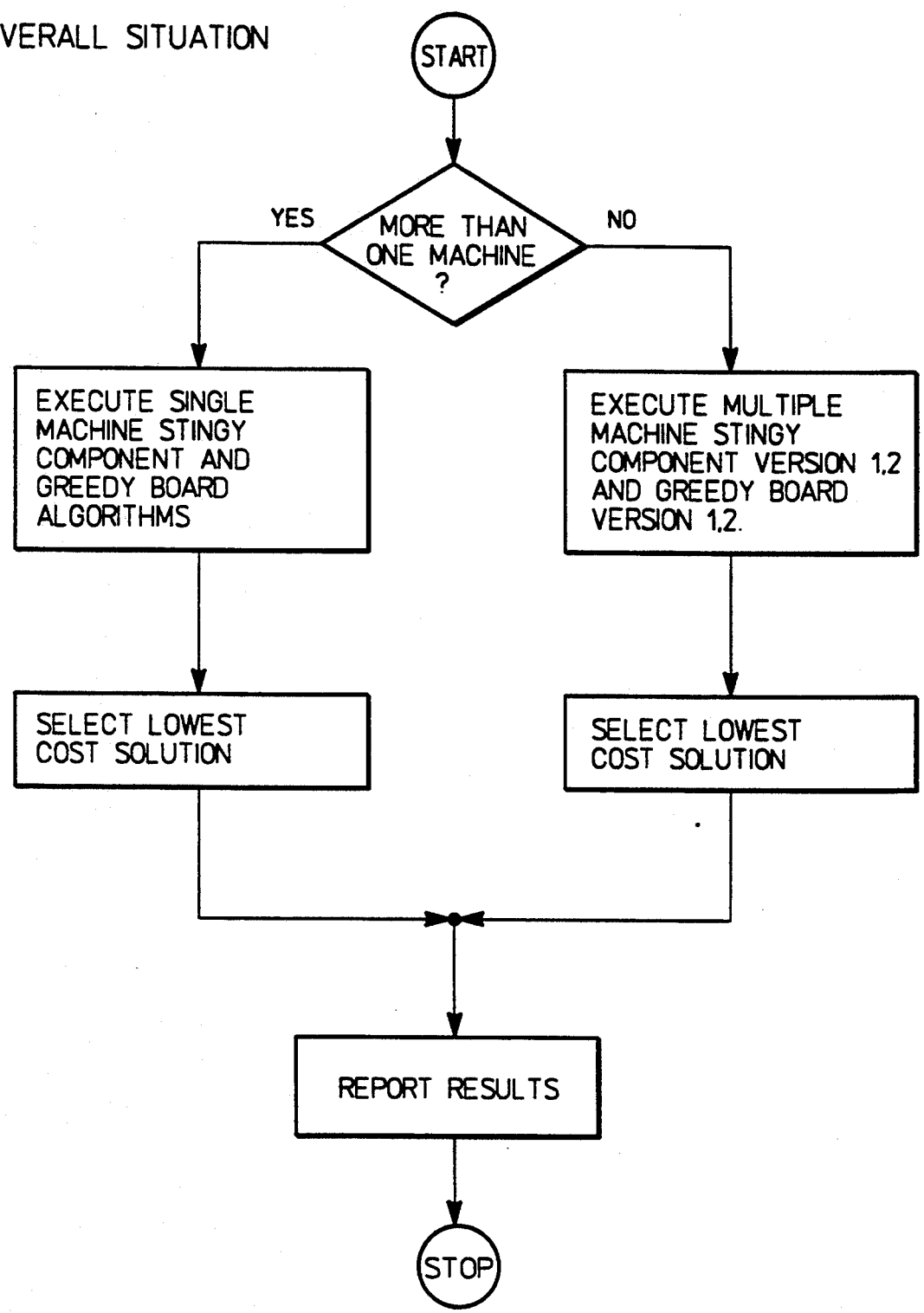
FIG. 6 is a high level flow chart of the invention.
Figure 7:
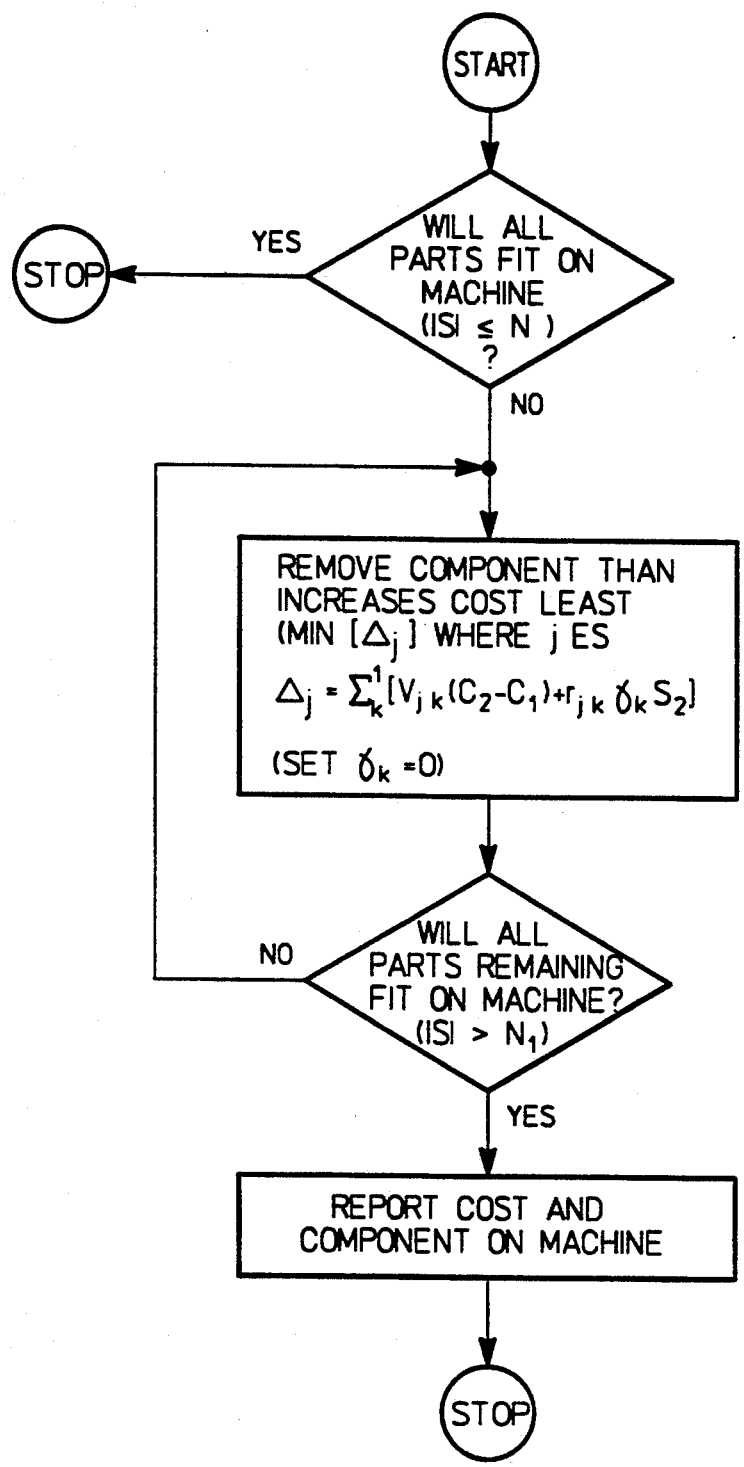
FIG. 7 is a flow chart showing the Stingy Component algorithm applied to a single machine assembly.
Figure 8:
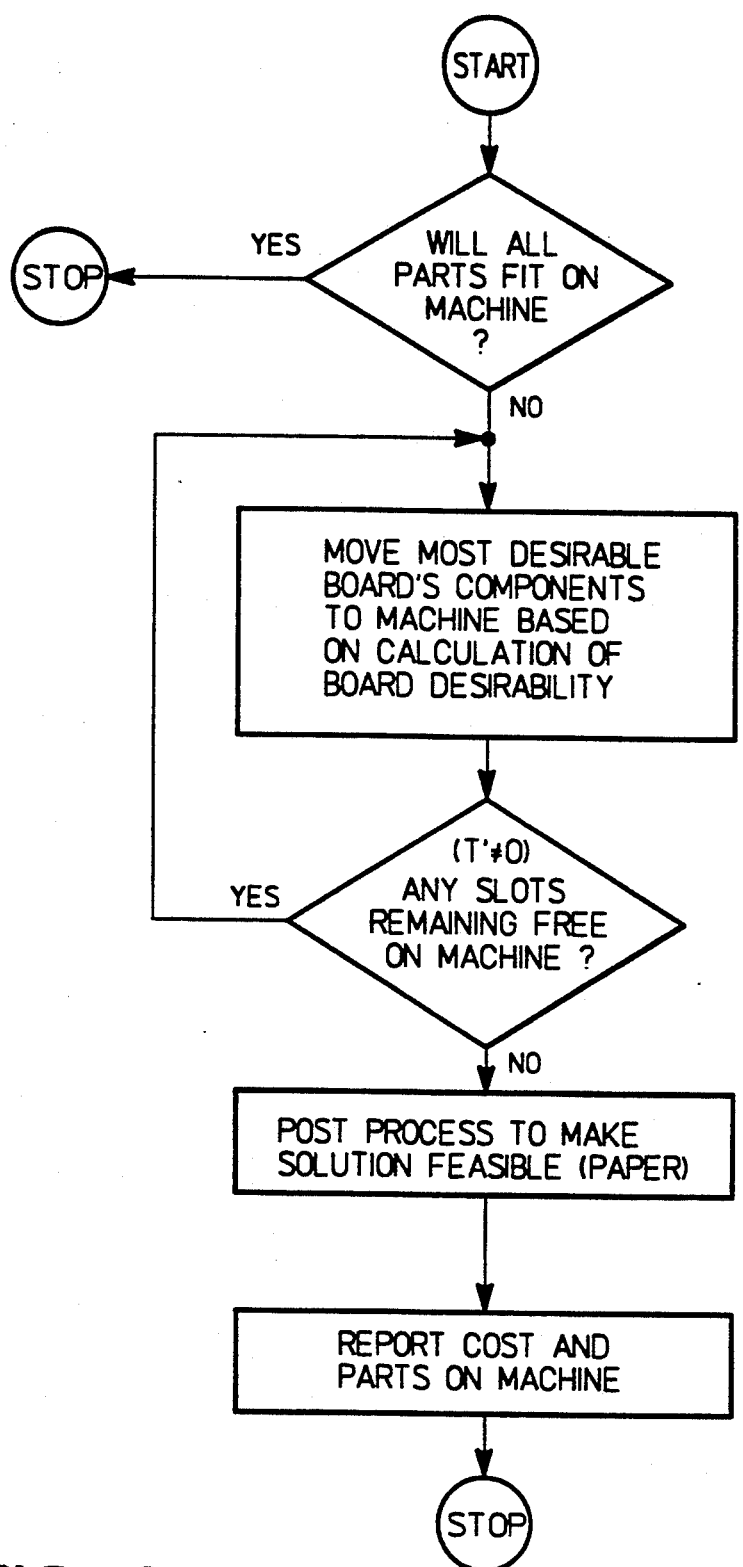
FIG. 8 is a flow chart showing the Greedy Board algorithm applied to a single machine assembly.
Figure 9:
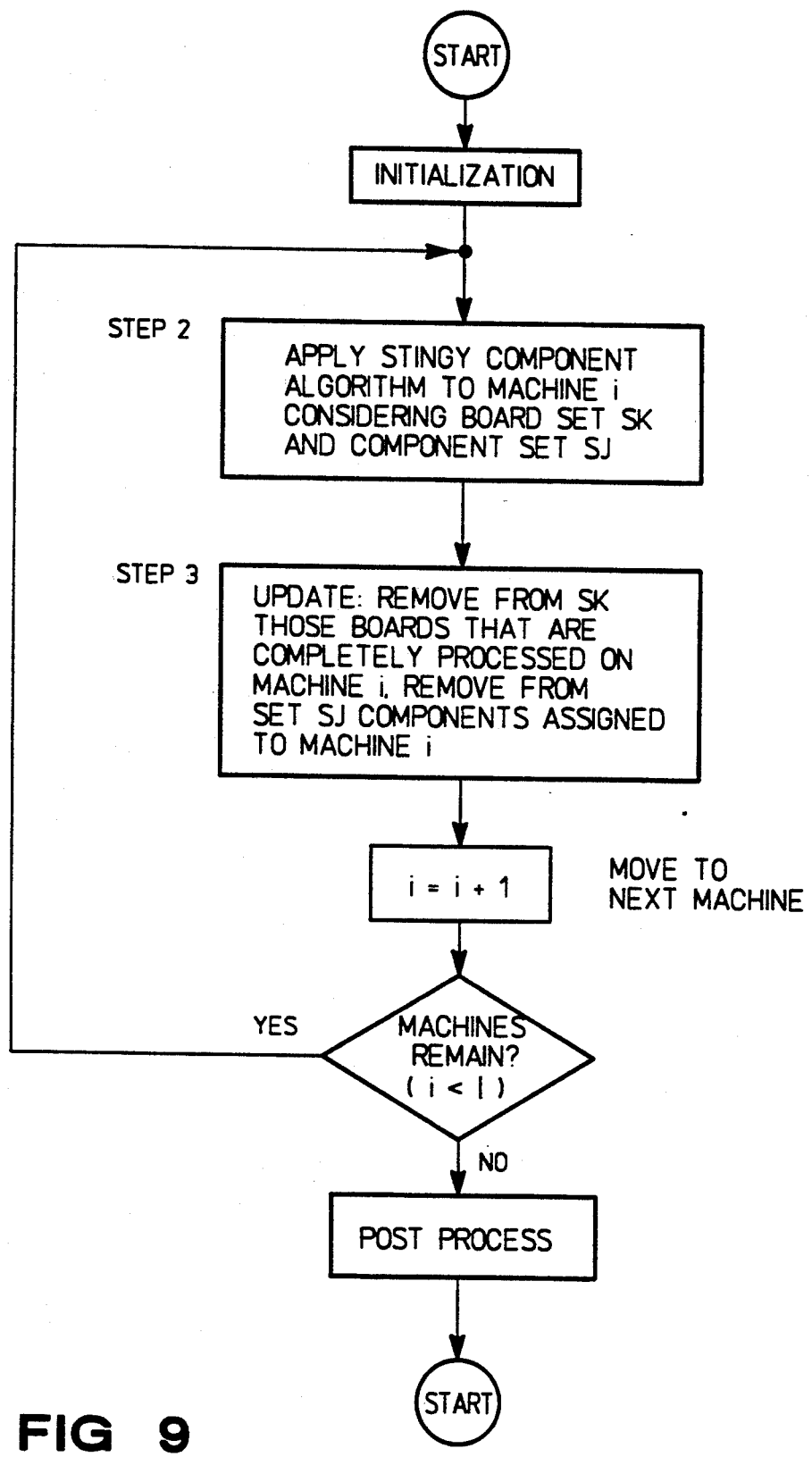
FIG. 9 is a flow chart showing the Stingy Component algorithm applied to a multiple machine assembly.

Finally, there is a low but not insignificant level of component commonality between boards. FIG. 2 shows an actual distribution of the number of different boards that components are used in for a representative sample of 58 boards and 180 components. In this instance, approximately 35% of the components are used in more than one board, and 5% of the components are used in 5 or more boards. This low commonality of components occurs in part because of the long product lives of many of these products which use the PC boards.

The problem we consider is that of determining which components (operations) to assign to each process (this may be any of the machines, or the manual assembly process) in order to minimize total setup and processing cost for assembling all boards. If components for any particular board are not all assigned to the same process (i.e., the same machine, or the manual assembly process), then the board must undergo more than one setup. (We assume, however, that the order of component insertion does not matter, so that at most one setup per process will be required for any one board). In order to avoid multiple setups, it is possible to assign the same component to different processes. Thus, the problem is also one of determining the layout of the different machines—that is, determining the extent to which assembly should be performed on parallel vs. serial processes. Note that we are solving a long term planning problem using estimates of expexted future demand for the next 6 to 12 months, so batching and sequencing are not issues of concern.

In effect, the objective is to form an operating policy (i.e., to determine flows of board types among machines) that provides a basis for tactical execution. Weekly planning may involve subcontracting out work in periods of high demand, and operator training classes in periods of low demand. In any case, once capacity and people have been positioned (we assume that this has already taken place), they represent a largely fixed cost, so a design is needed that allows for efficient tactical execution.

The objective of minimizing average expected cost per board produced reflects actual manufacturing planning and is appropriate for a long term planning problem of the type we are considering. Because we are solving a long term planning problem (using estimated future demand), it is sensible to consider minimizing the average cost per board produced, rather than measures such as makespan minimization and throughput maximization that may be applicable to a problem with a shorter horizon and known demand requirements. Note that costs may be expressed in terms of the time units required for each operation: in this case, because there may be parallel machines operating simultaneously, the objective is not equivalent to minimizing makespan but, rather, is equivalent to minimizing the average time required to process a board. (We assume that all boards can be processed in the available time; otherwise the problem does not have a feasible solution.)

In our model, operation assignments are determined using fixed estimates of future demand. A natural extension is to consider uncertainties in these demand estimates. In this case one would like to create assignment plans that are robust with respect to possible future changes in demand. Such assignment plans would yield low cost under a range of assumptions about levels of future demand for different products.

In the following section we formally define the problem as a mixed integer program. We discuss approaches for finding an exact solution. In many practical applications, however, a realistic problem may be too large to solve exactly. Furthermore, in a preferred embodiment, process engineers wanted a solution methodology that could be implemented on a desktop computer rather than a mainfram computer. Thus we develop solution heuristics for the problem. Initially we specialize our analysis to the case of one machine. We present two different solution heuristics. We characterize conditions under which the algorithms generate an optimal solution, present worse case examples, and present computational results for a randomly generated set of problems. We show that while each algorithm can be arbitrarily bad, for typical problems the algorithms perform well. Thereafter, we consider the more general case of multiple machines. We develop four different solution heuristics, and present computational experience. Finally, we will discuss implementation of our results on an actual assembly line.

PROBLEM FORMULATION

We let i be an index for processes $(1,2,3,\ldots,I-1=\text{machine}; I=\text{manual})$, j be an index for components $(j=1,\ldots,J)$, and k be an index for boards $(k=1,\ldots,K)$. Our goal is to determine optimal values for:

$x_{ijk}$ = assignment of component j of board k to process i, where $x_{ijk}=1$ if the assignment is made; 0 otherwise We also define the following dummy variables:

$y_{ik}=1$ if board k set up for any insertions on process i; 0 otherwise $z_{ij}=1$ if component j is assigned to process i; 0 otherwise Production requirements are:

$d_k$ = total demand for board k over the (fixed) time period $r_{jk}=1$ if component j is used in board k; 0 otherwise $n_{jk}$ = number of component j used in one of board type k Using these, we define:

$v_{jk}=d_k r_{jk} n_{jk}$ = total volume of component j used for boards of type k over the time period Setup and processing costs, by machine, are the same over all boards and components:

$s_i$ = setup cost for one setup of one board on process i $c_i$ = processing cost for one insertion by process i Finally, machine limitations are given by:

$N_i$ = total number of types of components that can be assigned to process i

Given these definitions, the problem can be expressed as:

$$\min \sum_i \sum_j \sum_k c_i v_{jk} x_{ijk} + \sum_i \sum_k s_i d_k y_{ik} \quad (1)$$

$$\text{s.t.} \sum_i x_{ijk} = r_{jk} \; \forall j,k \quad (2)$$

$$y_{ik} \geq x_{ijk} \; \forall i,j,k \quad (3)$$

$$z_{ij} \geq x_{ijk} \; \forall i,j,k \quad (4)$$

$$\sum_j z_{ij} \leq N_i \quad i=1,\ldots,I-1 \quad (5)$$

$$y_{ik} = 0,1 \; \forall i,k \quad (6)$$

$$x_{ijk} \geq 0 \; \forall i,j,k \quad (7)$$

$$z_{ij} \geq 0 \; \forall i,j \quad (8)$$

The objective (1) is to minimize total processing plus setup cost. Constraint (2) ensures that all necessary components will be assigned to a process; if any component for board k is assigned to a process, (3) sets the indicator variable $y_{ik}$ to 1 so that a setup will be charged. Constraints (4) and (5) express the upper limit on the number of different types of components that can be assigned to any process. The manual process is assumed to have $N_I=J$, and so is not included in (5). We note that, given (6), an integrality constraint on the $x_{ijk}$'s is not necessary; the above mixed ILP will always yield $x_{ijk}=0$ or 1 for all i,j,k. Similarly, we do not need to specify an integrality constraint for the $z_{ij}$'s (which are dummy variables): If all bins of process i are used in the cost-minimizing solution, then the $z_{ij}$'s will all be binary integer-valued for that process. If all bins are not used, the optimal solution is degenerate and the $z_{ij}$'s may not be binary integer-valued; however, this will not affect the optimal solution (specified by the $y_{ik}$'s and $x_{ijk}$'s). The problem is thus one of I.K binary integer variables and $I \cdot J \cdot (K+1)$ linear variables.

We note that the above formulation allows for the assignment of a single component type to more than one process. (The only constraint on assignment of components to processes (the $z_{ij}$'s) is that the number of different component types assigned to any one process cannot exceed the capacity of the process.) When setup times are high relative to processing costs (so that it is costly to produce a board using more than one process), and all boards that use a particular high volume component cannot be fully assembled on any one machine because their combined requirement for component types is larger than the number of component slots available, then it may be optimal to assign the component to more than one process.

One solution approach for this problem is to use branch and bound, branching on component assignments (i.e., set $z_{ij}=0$ or 1), and bounding by solving a relaxed linear program (dropping the integrality constraint on the $y_{ik}$'s). An efficient way to carry out the branching process may be to branch first on the most frequently used components (that is, those with the highest value of $$\sum_k v_{jk}),$$

since those components will have the greatest effect on total cost. We do not need to explicitly specify whether or not a component is assigned to the manual process: since the manual process is assumed to be uncapacitated, components will automatically be assigned to that process by the linear program if necessary or desirable. A good initial upper bound can be obtained using the heuristics presented in Sections 3 and 4.

The difficulty with solving the integer program exactly for a realistic problem is the large problem size. For example, a medium sized 2-process assignment problem (with one machine, plus the manual process) might involve 200 boards and 6000 components—leading to 12,000 binary integer variables and over 2 million linear variables. Even with no integer restrictions, such a problem is too large to solve using current LP codes. Furthermore, in our experimental applications process engineers wanted a solution methodology that could be implemented on a desktop computer rather than a mainframe computer. Thus, we now develop heuristic ways of solving the problem. We first consider the case of one machine, and then the case of multiple machines.

A SINGLE MACHINE PROBLEM

In this section, we specialize our discussion to the case of one machine. We let i=1 represent the machine and i=2 the manual process. The problem then reduces to one of determining which components to assign to the machine ($z_{ij}$): Once the machine bins have been filled, all unassigned components are assigned to the manual process. In addition, some components assigned to the machine may also be assigned to the manual process. Given the component assignments, the cost minimizing solution for each board (the $x_{ijk}$'s and corresponding $y_{ik}$'s) can be determined individually.

Although a realistically sized problem is too large to be practically solved by an exact solution method, certain special characteristics of the problem enable us to construct excellent near-optimal solution approaches. First, some components are used much more frequently than others and some boards are assembled much more frequently than others (data in FIG. 1 verify that both component and board usages follow the well-known "80/20" rule). Since both setup and insertion are cheaper on a machine than on the manual process, we would expect that the optimal solution would assign many (or all) of the frequently used components and/or boards to a machine. We also observe that, excluding certain frequently used components, boards do not tend to have much component commonality. This motivates us to construct two different solution heuristics based on a "greedy" approach, one of which assigns individual components, and one which assigns entire boards.

Our first solution approach, which we refer to as the "Stingy Component" algorithm, starts by assigning all components to the machine (thus exceeding the machine's capacity constraint) and then sequentially removing components which cause the smallest cost increase, until the machine's capacity constraint is met. All components not assigned to the machine are assigned to the manual process. In addition, some components may be assigned to both processes if a lower cost can be achieved.

The idea behind this approach is that many of the less frequently used components will never be assigned to the machine in a cost-minimizing solution and, similarly, one would expect the most frequently used components to always be assigned to the machine. Since the "stingy" approach focuses on assigning individual components rather than entire boards, we would expect the algorithm to perform well when setup costs are low. In fact, when setup costs are zero, the stingy algorithm always generates the optimal problem solution, since in that case each component can be considered individually.

We let $i=1$ represent the machine and $i=2$ the manual process. Then we have:

"Stingy Component" Algorithm
1. Initialization: Let $S=\{1,\ldots,J\}$. Let $\delta_k=1$ for all $k$, and $$J = \sum_{k=1}^{K} [v_{jk}c_1 + s_1].$$

If $|S| \leq N_1$, STOP.
2. "Stingy" Component Removal:
Calculate $$\Delta_j = \sum_{k=1}^{K} [v_{jk}(c_2 - c_1) + r_{jk}\delta_k s_2]$$

for all $j \in S$. Find $$l = \arg\min_{j \in S} [\Delta_j].$$

Let $S=S-l$, $J=J+\Delta_l$, and for $k$ s.t. $\delta_k r_{lk}=1$, set $\delta_k=0$.

3. Post-Processing: If $|S| \geq N_1$, return to Step 2. Otherwise,
 (i) For all $j \in S$: set $x_{2jk}=r_{jk}$, $x_{1jk}=0$, for all $k$.
 (ii) For all $k$ s.t. $\delta_k=1$: set $y_{1k}=1$, $y_{2k}=0$, and $x_{2jk}=0$, $x_{1jk}=r_{jk}$ for all $j$.
 (iii) For all $k$ s.t. $\delta_k=0$: set $y_{2k}=1$, and if $$s_1 + \sum_{j \in S} v_{jk}c_1 > \sum_{j \in S} v_{jk}c_2,$$

then set $y_{1k}=0$, $x_{1jk}=0 \,\forall j$, $x_{2jk}=r_{jk} \,\forall j$, and $$J = J + \left[\sum_{j \in S} v_{jk}(c_2 - c_1)\right] - s_1;$$

otherwise, set $y_{1k}=1$, and $x_{1jk}=r_{jk}$, $x_{2jk}=0 \,\forall j \in S$. Stop.

Step 1 assigns all components to the machine. In Step 2, the incremental cost of removing each component from the machine ($\Delta_j$) is calculated; this consists of the incremental variable processing cost per unit ($c_2-c_1$) times the total affected volume $$\left(\sum_{k} v_{jk}\right),$$

plus the incremental manual setup cost for any boards using that component which have not yet incurred a manual setup cost (i.e., those boards for which $\delta_k=1$ at this step.) The component which adds the minimum incremental cost is removed, and the objective function, setup indicators ($\delta_k$), and costs are updated. The removal process continues until the bin capacity of the machine is exactly met. Step 3 is a post-processing step that sets the decision variables. All boards which incur no manual setup ($\delta_k=1$) are processed completely by the machine. For those boards that do incur a manual setup ($\delta_k=0$), a decision is made about whether or not to process the board entirely on the manual process; if it is cheaper to do so, the decision variables are adjusted and the objective function is updated.

We observe that each time Step 2 is reached, at most J sums are calculated, and one sort is performed, leading to a maximum of $J^2 \log(J)$ calculations each time. Step 2 is reached $J-N_1$ times, so an upper limit on the computational complexity for the Stingy Component algorithm is $J^3 \log(J)$ steps.

Our second solution approach, which we refer to as the "Greedy Board" algorithm, starts by assigning all boards to the manual process, and then assigns entire boards to the machine, one by one, to maximize incremental boards produced per incremental component bin used. In contrast to the Stingy Component algorithm, the Greedy Board algorithm focuses on entire boards. The ideas motivating this approach are that: (a) because of the expected low level of component commonality, it may be better to assign boards entirely to the machines or the manual process, rather than splitting them; and (b) consideration of existing component commonality may yield cost saving combinations of boards assigned to the machine.

The algorithm can be formally stated as follows:
"Greedy Board" Algorithm
1. Initialization: Let $S=\phi$, $T=\{1,\ldots,K\}$, and $$J = \sum_{k=1}^{K} [v_{jk}c_2 + s_2].$$

2. "Greedy" Board Loading: Calculate $$\gamma_k = \left[ \sum_{j \notin S} r_{jk} \right] / d_k$$

for all $k \in T'$ where $$T' = \left\{ k \epsilon T: \sum_{j \notin S} r_{jk} \leq N_1 - |S| \right\}.$$

Find $m = \arg\min_{k \epsilon T'} [\gamma_k]$.

Let $T=T-m$, $S=S+\{j:r_{jm}=1\}$, $J=J+[v_{jm}(c_1-c_2)+s_1-s_2]$.

3. Post-Processing: If $T' \neq \phi$, return to Step 2. Otherwise,
(i) For all $j \notin S$: set $x_{2jk}=r_{jk}$, $x_{1jk}=0$, for all k.
(ii) For all $k \notin T$: set $y_{1k}=1$, $y_{2k}=0$, and $x_{2jk}=0$, $x_{1jk}=r_{jk}$ for all j.
(iii) For all $k \in T$: set $y_{2k}=1$, and
if $$s_1 + \sum_{j \epsilon S} v_{jk} c_1 > \sum_{j \epsilon S} v_{jk} c_2,$$

then set $y_{1k}=1$, $x_{1jk}=r_{jk}$ $\forall$ j, $x_{2jk}=0$ $\forall$ j, and $$J = J + \left[ \sum_{j \epsilon S} v_{jk}(c_1 - c_2) \right] + s_1;$$

otherwise, set $y_{1k}=0$, and $x_{1jk}=0$, $x_{2jk}=r_{jk}$ $\forall j \epsilon S$. Stop.

Step 1 assigns all boards to the manual process. In Step 2, the incremental number of new component slots per board produced ($\gamma_k$) is calculated for each board whose incremental assignment to the machine will not violate the slot capacity constraint (represented by $k \epsilon T$), and the board with the minimum value is assigned to the machine. (This is equivalent to "greedily" maximizing incremental boards produced per additional slot used.) The process continues until no more (entire) boards can be assigned to the machine. Step 3, the post-processing step, is similar to that for the Stingy Component heuristic (in this case, for boards which incur a manual setup (i.e., $k \epsilon T$), a decision is made as to whether or not to process some of the components on the machine).

For the Greedy Board algorithm, each time Step 2 is reached, at most K sums and one sort over K are performed, leading to $K^2 \log(K)$ computations. Step 2 is reached at most K times, so an upper limit on the computation required is $K^3 \log(K)$ steps. Since $K \leq J$, and in a typical problem $K << J$, the Greedy Board algorithm will typically require less computation than the Stingy Component algorithm.

We observe that when there is no component commonality across boards, and the Greedy Board algorithm can exactly fill the component slots on the machine, then the algorithm will always yield the optimal solution. In this case, the algorithm is akin to the High Ratio First algorithm for the 0-1 knapsack problem—a greedy heuristic which sequentially adds items to the knapsack based on their value-to-weight ratio; that heuristic provides an optimal solution when the knapsack can be exactly filled. We might also expect the Greedy Board algorithm to perform well when processing costs on the two processes are similar, because in that case no cost savings can be achieved by splitting boards. However, even if the manual and machine processing costs are identical, and the Greedy Board algorithm uses all machine slots, the algorithm may not yield the optimal solution, since the algorithm takes into account component commonality only myopically. The optimal solution under these conditions is one which maximizes the volume of boards assigned to the machine. The Greedy Board algorithm will not necessarily yield that solution. An example is shown in FIG. 3.

We now investigate the performance of the two solution algorithms. We show that while the worst case performance of each heuristic can be arbitrarily bad, on average each performed quite well over a large sample of randomly generated problems.

Because our problem is one of minimization, we use the worst case performance ratio $R=[J_H-J^*]/[J_{max}-J^*]$; here, $J_H$ represents the cost of the heuristic solution, $J^*$ the optimal solution, and $J_{max}$ an upper bound on the maximum objective function value. The closer the ratio is to 1, the worse the performance of the heuristic. For an upper bound we use $$J_{max} = \sum_k \left[ d_k s_2 + \sum_j v_{jk} c_2 \right];$$

this corresponds to assembling all boards on the manual process.

Proposition 1

The Stingy Component heuristic can generate an arbitrarily poor solution.

Proof

Consider the example shown in FIG. 4. For the Stingy Component heuristic, $J_H = v[2s_1 + 2N_1 c_1 + N_1 s_2 + N_1 c_2]$ while $J^* = v[N_1 s_1 + N_1 c_1 + 2s_2 + 2N_1 c_2]$. The upper bound is $J_{max} = v[(N_1+2)s_2 + (3N_1)c_2]$. Thus, $$R = \frac{(N_1 - 2)(s_2 - s_1) - N_1(c_2 - c_1)}{N_1(s_2 - s_1) + N_1(c_2 - c_1)}$$
$$= 1 + \frac{-2(s_2 - s_1) - 2N_1(c_2 - c_1)}{N_1(s_2 - s_1) + N_1(c_2 - c_1)}$$
$$= 1 + \frac{(-2/N_1)(s_2 - s_1) - 2(c_2 - c_1)}{(s_2 - s_1) + (c_2 - c_1)}.$$

As $N_1$ becomes sufficiently large, this expression approaches $1+[-2(c_2-c_1)]/[(s_2-s_1)+(c_2-c_1)]$ and for values of $(c_2-c_1)$ sufficiently close to zero, $R \to 1$.♦

We can similarly show by example that the Greedy Board heuristic can produce arbitrarily poor solutions.

Proposition 2

The Greedy Board heuristic can generate an arbitrarily poor solution, even when it uses all slots on the machine.

Proof

Consider the example shown in FIG. 5. There are $2N_1$ components. The first $N_1$ boards each use one component, $1, \ldots, N_1$. The remaining boards each use one of the first $N_1$ components, plus two or more of components $N_1+1, \ldots, 2N_1$. All such possible combinations are included; so, for example, the number of different boards using two of the components $N_1+1, \ldots, 2N_1$ (plus one of components $1, \ldots, N_1$) is $$\binom{N_1}{2}(N_1).$$

The Greedy Board heuristic uses all slots on the machine (as does the optimal solution). For this example, $$R = 1 + \frac{(-N_1)(s_1 - s_1) + (-N_1)(c_2 - c_1)}{\left[\sum_{i=2}^{N_1}\binom{N_1}{i}(N_1)(s_2 - s_1) + \sum_{i=2}^{N_1}\binom{N_1}{i}(N_1)(i)(c_2 - c_1)\right]}$$

$$= 1 - \frac{(s_2 - s_1) + (c_2 - c_1)}{\left[\sum_{i=2}^{N_1}\binom{N_1}{i}(s_2 - s_1) + \sum_{i=2}^{N_1}\binom{N_1}{i}(i)(c_2 - c_1)\right]}$$

Clearly, as $N_1$ gets large, $R \to 1$.

In order to assess average performance, the two algorithms were tested on a set of problem instances that were randomly generated from observed distributions of board volume and component frequency and commonality in the assembly process. The setup and processing costs used reflect relative actual costs, and are proportional to the time required for each operation. For each problem, the true optimal solution was determined by exhaustive search. Computational results are shown in Table 1.

an initial assignment of components to machines, we carry out a post-processing step to determine if some boards can be made more cheaply by reassigning them. For each of the single machine heuristics (Stingy Component and Greedy Board), we develop two different multiple machine heuristics. These heuristics differ in the extent to which we allow part assignment to more than one machine: In the first case, if component j is assigned to machine i, then when we assign components to machine i+1 we no longer consider component j; while in the second case, we do consider potential assignment of component j to machine i+1. Our two adaptations of the Stingy algorithm for the case of multiple machines are as follows:

Multiple Machine Stingy Component Algorithm: Version 1

1. Initialization: Let i=1. Let SK={1, \ldots ,K}, SJ={1, \ldots ,J}.

2. "Stingy" Component Assignment: Apply the Stingy Component Algorithm to machine i, considering the board set SK and component set SJ.

2. Updating: Remove from SK those boards that are completely processed on machine i, and remove from set SJ those components assigned to machine i. Let i=i+1. If i<I, return to Step 2.

3. Post-Processing: Given the assignment of components to machines: for each board not completely processed on a single machine, determine the least cost way to produce the board (i.e., on a combination of machines vs. machine and manual vs. manual only).

Stop.

The second version of our Multiple Machine Stingy Component algorithm differs only in that, after apply-

TABLE 1

| | | | | The Case of a Single Machine: Computational Results for Randomly Generated Problems | | | | | |
|---|---|---|---|---|---|---|---|---|---|
| # of Problems Tested | # of Boards | # of Components | # of Slots | Stingy Avg. Error* | Stingy Max. Error | Greedy Avg. Error | Greedy Max. Error | Compound Avg. Error | Compound Max. Error |
| 100 | 10 | 15 | 9 | 3.14% | 21.53% | 4.23% | 31.13% | 1.74% | 21.53% |
| 30 | 10 | 20 | 12 | 4.83% | 15.22% | 4.19% | 17.22% | 3.03% | 10.27% |

*Percent deviation from the optimal solution

For problems of size 10×15 (10 boards and 15 components), the Stingy heuristic was slightly better than the Greedy heuristic, with an average error of about 3.1%, as compared to 4.2% for the Greedy heuristic. For problems of size 10×20, the Greedy heuristic performed better, with an average error of 4.2% versus 4.8% for the Stingy heuristic. Interestingly, while the average error increased slightly for the large sized problems, the maximum error for each heuristic decreased significantly.

Since the two heuristics focus on different aspects of the problem (the Stingy heuristic focuses on individual component volume, while the Greedy heuristic focuses on component commonality between boards), a compound heuristic using the minimum of the two solutions was created; the average performance of the compound heuristic was significantly better than either algorithm alone.

THE MULTIPLE MACHINE PROBLEM

We now consider the original multiple machine problem. We assume that the machines are identical, so that $s_i = s_{i+1}$, $c_i = c_{i+1}$, $N_i = N_{i+1}$, $i = 1, \ldots, I-1$; this is the case in our applications.

Our solution approach for the multiple machine case is to apply our single machine heuristics to each machine sequentially; then, as before, once we have made ing the Single Machine Stingy Component algorithm, we remove from consideration only those components associated only with boards that can be completely processed on machine i:

Multiple Machine Stingy Component Algorithm: Version 2

1. Initialization: Let i=1. Let Sk={1, \ldots ,K}, SJ={1, \ldots ,J}.

2. "Stingy" Component Assignment: Apply the stingy Component Algorithm to machine i, considering the board set SK and component set SJ.

2. Updating: Remove from SK those boards that are compeltly processed on machine i, and remove from set SJ those components that are associated only with boards that can be completely processed on machine i. Let i=i+1. If i<I, return to Step 2.

3. Post-Processing: Given the assignment of components to machines: for each board not completely processed on a single machine, determine the least cost way to produce the board (i.e., on a combination of machines vs. machine and manual vs. manual only).

Stop.

Analogously, we develop two versions of a Multiple Machine Greedy Board algorithm:

Multiple Machine Greedy Board Algorithm: Version 1

1. Initialization: Let i=1. Let SK={1, . . . ,K}, SJ={1, . . . ,J}.
2. "Greedy" Board Assignment: Apply the Greedy Board Algorithm to machine i, considering the board set SK and component set SJ.
2. Updating: Remove from SK those boards that are completely processed on machine i, and remove from set SJ those components assigned to machine i. Let i=i+1. If i<I, return to Step 2.
3. Post-Processing: Given the assignment of components to machines: for each board not completely processed on a single machine, determine the least cost way to produce the board (i.e., on a combination of machines vs. machine and manual vs. manual only). Stop.

The second version is:

Multiple Machine Greedy Board Algorithm: Version 2

1. Initialization: Let i=1. Let SK={1, . . . ,K}, SJ={1, . . . ,J}.
2. "Greedy" Board Assignment: Apply the Greedy Board Algorithm to machine i, considering the board set SK and component set SJ.
2. Updating: Remove from SK those boards that are completely processed on machine i, and remove from set SJ those components that are associated only with boards that can be completely processed on machine i. Let i=i+1. If i<I, return to Step 2.
3. Post-Processing: Given the assignment of components to machines: for each board not completely processed on a single machine, determine the least cost way to produce the board (i.e., on a combination of machines vs. machine and manual vs. manual only). Stop.

These algorithms were tested on a set of 30 two-machine problem instances that were randomly generated from observed distributions of board volume and component frequency and commonality in the assembly process. The setup and processing costs used reflect relative actual costs and are proportional to the time required for each operation. The problem instances each involved 20 boards and 100 components, with 35 component slots available on each of the two machines. Because of the large problem size (100 components), it was not possible to determine the true optimal solution for each problem, so instead we used as a lower bound the cost of producing each board on a single machine:

$$J_{min} = \sum_k \left[ d_k s_1 + \sum_j v_{jk} c_1 \right].$$

Results are shown in Table 2. For all 30 problems, the Greedy Board algorithms were superior to the Stingy Component algorithms, with Version 2 of the Greedy algorithm yielding the best solutions. The average deviation from $J_{min}$ for the Stingy Component solutions was 7–10%, while the average deviation from $J_{min}$ for the Greedy Board algorithm was 3–5%. These percentage differences are encouragingly small, considering the fact that the measured deviation is based on comparison to an infeasible lower bound.

We note that each of our multiple machine heuristics applies the individual stingy or greedy heuristic to each machine; thus, the computational complexity of the Multiple Machine Stingy Component algorithms is $I \cdot J^3 \log(J)$, while the computational complexity of the Multiple Machine Greedy Board algorithms is $I \cdot K^3 \log(K)$.

These differences are reflected in the running time of the algorithms. For the two-machine examples of Table 2, running time using a PASCAL program on a Macintosh IIc/x was an average of 27 seconds for the Stingy Component algorithms, and an average of 3 seconds for the Greedy Board algorithms.

Thus far we have made no mention of workload balancing. It is possible that the above solution algorithms may generate solutions in which some machines are assigned a much larger volume of production than other machines. We deal with issue of workload balancing in the following manner: When we execute the solution algorithm, we set the number of available slots on each machine to a number slightly smaller than the actual number of slots available. (In our example applications, we used a number that was approximately 97% of the actual slot capacity.) Then, on an ad hoc basis, we consider potential reassignment of boards among the processes. We fill the unused slots with certain frequently used components to enable us to make the reassignment. This procedure was quite effective in our following experimental applications.

IMPLEMENTATION

Our algorithms were applied to two different PC board manufacturing problems

In both applications, the Greedy Board approach was used. One reason this approach was favored over the Stingy Component approach was that setup costs were high relative to insertion costs, and the Greedy Board approaches tend to yield fewer setups for each board. In addition, the Greedy Board approach was preferred by process engineers because boards assembled completely using one process tend to have higher quality and lower rework requirements than do boards produced using more than one process.

The first application involved component assignment in a division that manufactures test and measurement equipment. The division had been manually assembling a mix of almost 500 boards from several thousand components. The division had purchased six new semi-automatic component insertion machines, each of which had slots for 640 components, and wanted to shift some of the production to the machines. This problem was solved using Version 2 of the Multiple Machine Greedy Board Algorithm. The result of the algorithm was a partition of the boards into families that could be processed together on the same machine. After applying the algorithm to determine board families, one for each of the six machines, and the remainder for the manual process, a subsequent step was taken to reassign some of the boards among the machines in order to balance the workloads of the different machines. This reassignment, performed using the procedure described was carried out because each of the 6 machines was manned by a different operator. The manufacturing process was then set up to reflect these board families.

The second application involved the manufacture of PC boards for computers in another division. In this operation, a wide mix of boards is assembled on a surface mount technology (SMT) line that consists of a set of pick-and-place component insertion machines. In producing two sequential boards, any components needed for the second board that are not on the machines when the first board is completed, must be set up on the machines before the second board can be produced. However, no additional setups are required when two boards of the same type are produced sequentially. The problem was to determine a production plan for the boards that would minimize production cost. Two different solution approaches were considered. The first approach, was to apply real-time sequencing of boards in order to minimize the setup time between boards; this approach minimizes the number of new components that must be set up on a machine before the next board can be produced. The second approach was to apply Version 2 of the Multiple Machine Greedy Board Algorithm to group the boards into families that could be produced with no setup between boards; in this case, the number of machine slots considered by the algorithm equals the total number of machine slots in the SMT line. Step 2 of the algorithm was repeated until all boards were grouped into families. The idea with the Greedy Board solution is to set up once for a single board family, produce all boards in that family, and then set up for the next board family, etc. Once the boards were grouped into families, workloads associated with different board groups were balanced using the procedure outlined. Boards were switched between groups until the production volumes of different groups were balanced appropriately.

Both the setup minimizing and Greedy Board solutions were evaluated using a computer simulation. While the setup minimization approach yielded a solution with 2% more throughput than the Greedy Board approach, the setup minimizing solution incurred long cycle times for boards, since the real-time setup minimization algorithm can indefinitely postpone assembly of some boards if they incur too much setup time. The Greedy Board solution had the advantage of shorter cycle times. In addition, the manufacturing process is much simpler to manage when boards are grouped into families, since only one setup must be performed for each family of boards. For these reasons, the Greedy Board solution was chosen and implemented.

In view of all the foregoing, it will be understood by those skilled in the art that the invention provides two different heuristic solution approaches, one of which focuses on assigning components while the other focuses on assigning boards. Both algorithms yield good solutions for problems similar to those described above, but given cost data for certain actual assembly processes, the Greedy Board algorithms provided slightly better solutions in the experimental applications. This reflects the fact that the Stingy Component algorighms will tend to provide better solutions when the setup costs are low. The Greedy Board algorithms appear to provide better solutions when setup costs are high. The Greedy Board approach was found to have the additional advantage of providing a solution in which most boards are assigned to only one process: this leads to higher quality and lower rework requirements than an assignment that splits boards across processes.

We have discussed experimental implementation of our results for two different production processes. The first application—component assignment for PC Goard assembly in a test and measurement—was the original problem that gave rise to our model and solution approaches. The second application—creating board families for PC board production in a computer manufacturing operation—shows the link between our solution approaches and group technology concepts. Our approach is believed to have an advantage over traditional group technology approaches since we consider not only commonality of components between different products, but also product and component volume.

As formulated, our model considers the setup cost associated with different assembly processes, but does not consider the transportation time or cost required to move a board between different processes. In our particular applications, transportation cost was not significant because machine capacities were quite large relative to component requirements of individual boards; thus, it rarely happened that a board was split among more than two processes when the problem was solved. In some applications, however, consideration of transportation cost between processes may be important. A simple way to extend the model (and our solution heuristics) to incorporate transportation times is to assume a fixed transportation cost (t) between any two processes and add a transportation cost equal to $$\left(-1 + \sum_i y_{ik}\right) t$$

to the objective function (1). Then in the Stingy Component algorithm, when we add incremental setup cost (Step 2), we also add transportation cost. We do not need to add transportation cost when making initial assignments using the Greedy Board algorithm (Steps 1 and 2) since no boards are split between processes. Then, during the post-processing step (Step 3) transportation cost can be added in both algorithms.

Our Greedy Board and Stingy Component algorithms are designed to take advantage of the data structure typically found in PC board assembly processes: our algorithms exploit certain characteristics of PC board demand and component requirements, such as component commonality and wide variations in component usage and board demands. We showed that, for typical PC board and component demand data, the algorithms yields solutions that are very close to optimal.

While preferred exemplary embodiments of the invention have been described, it is to be understood that various changes and modifications can be made without departing from the spirit and scope of the invention as defined by the following claims.

We claim as our invention:

1. A method for design of a production process by determining the assignment of operations to one or more machines, each machine having a given capacity for installing multiple parts to items in an assembly line, the method comprising the steps of:
   (a) preparing a list of parts of each different item being assembled;
   (b) determining the production demand for each different item;
   (c) applying an algorithm based on said parts list and said production demand to determine an assignment of operations to the one or more machines so that total setup and processing cost are minimized, including starting with a minimum cost solution for a machine having unlimited parts installation capacity and then selectively removing parts so as to minimize processing cost until the number of parts is within the actual machine capacity; and
   (d) assigning operations to the one or more machines based on the results of step (c).

2. A method for design of a production process by determining the assignment of operations to one or more machines, each machine having a given capacity for installing multiple parts to items in an assembly line, wherein the method is used for design of an assembly line for installing components on a printed circuit board and the method comprises the steps of:

(a) preparing a list of parts of each different item being assembled;

(b) determining the production demand for each different item;

(c) applying an algorithm based on said parts list and said production demand to determine an assignment of operations to the one or more machines so that total setup and processing cost are minimized, including developing an assembly model based on applying an algorithm which includes starting with a minimum cost solution for a machine having unlimited parts installation capacity and then selectively removing parts so as to minimize processing cost until the number of parts is within the actual machine capacity, and also developing another assembly model based on applying an algorithm which includes starting with a maximum cost solution of all items having parts installed without using the machine, and then selectively moving installation to the machine based on part to volume ratio, and then implementing on the assembly line the lower cost solution of the assembly models; and (d) assigning operations to the one or more machines based on the results of step (c).

* * * * *